United States Patent
Worlitz

(10) Patent No.: US 10,377,268 B2
(45) Date of Patent: Aug. 13, 2019

(54) MOTOR VEHICLE INTERIOR ARRANGEMENT

(71) Applicant: Faurecia Autositze GmbH, Stadthagen (DE)

(72) Inventor: Claudia Worlitz, Hannover (DE)

(73) Assignee: Faurecia Autositze GmbH, Stadthagen (DE)

( * ) Notice: Subject to any disclaimer, the term of this patent is extended or adjusted under 35 U.S.C. 154(b) by 79 days.

(21) Appl. No.: 15/687,680

(22) Filed: Aug. 28, 2017

(65) Prior Publication Data

US 2018/0099582 A1    Apr. 12, 2018

(30) Foreign Application Priority Data

Oct. 8, 2016  (DE) .................... 20 2016 105 638 U

(51) Int. Cl.

| | |
|---|---|
| *B60N 2/58* | (2006.01) |
| *B60N 2/02* | (2006.01) |
| *B60Q 3/233* | (2017.01) |
| *B60N 2/90* | (2018.01) |
| *B60N 2/806* | (2018.01) |
| *B60N 2/16* | (2006.01) |
| *B60N 2/20* | (2006.01) |
| *B60N 2/56* | (2006.01) |
| *B60N 2/66* | (2006.01) |
| *H03K 17/96* | (2006.01) |

(52) U.S. Cl.
CPC ............. *B60N 2/0228* (2013.01); *B60N 2/58* (2013.01); *B60N 2/0284* (2013.01); *B60N 2/16* (2013.01); *B60N 2/20* (2013.01); *B60N 2/56* (2013.01); *B60N 2/66* (2013.01); *B60N 2/806* (2018.02); *B60N 2/976* (2018.02); *B60N 2/99* (2018.02); *B60Q 3/233* (2017.02); *H03K 17/962* (2013.01)

(58) Field of Classification Search
CPC .... A47C 7/72; B60N 2/58; A47B 1/08; A45F 5/00; A45F 2005/008; A45F 2200/0516
USPC ................... 297/217.3, 463.1, 452.6, 452.38
See application file for complete search history.

(56) References Cited

U.S. PATENT DOCUMENTS

| | | | | |
|---|---|---|---|---|
| 1,853,579 | A * | 4/1932 | Sallop ................. | B60N 2/6027 297/223 |
| 2,667,211 | A * | 1/1954 | Krasnov ................ | A47C 31/11 297/224 |
| 4,047,756 | A * | 9/1977 | Ney ........................ | B60N 2/58 297/219.1 |
| 4,366,342 | A * | 12/1982 | Breedlove ........... | H01L 21/4846 174/260 |
| 5,401,922 | A * | 3/1995 | Asta ....................... | B60Q 5/003 200/5 A |
| 5,540,167 | A * | 7/1996 | Mussig ................. | A41D 27/24 112/10 |

(Continued)

*Primary Examiner* — Shin H Kim
(74) *Attorney, Agent, or Firm* — Laurence P. Colton; Smith Tempel Blaha LLC

(57) ABSTRACT

A motor vehicle interior arrangement, in particular a motor vehicle seat, having a decorative element, in particular piping or a decorative strip, which is arranged at least with an outer side visible on a part of the motor vehicle interior arrangement, in particular on a seat cover or an inner wall of the motor vehicle interior arrangement, characterized in that the decorative element has an electrically conductive element which generates an electrical field, to control or actuate certain functions in the motor vehicle interior.

10 Claims, 4 Drawing Sheets

(56) References Cited

U.S. PATENT DOCUMENTS

| | | | | |
|---|---|---|---|---|
| 5,965,856 A * | 10/1999 | Okada | B60N 2/002 | 200/514 |
| 6,079,779 A * | 6/2000 | Tanaka | B60N 2/585 | 297/219.1 |
| 6,084,217 A * | 7/2000 | Bulgajewski | H05B 3/14 | 219/219 |
| 6,150,642 A * | 11/2000 | Weiss | H05B 3/34 | 219/217 |
| 6,194,692 B1 * | 2/2001 | Oberle | H05B 3/34 | 219/528 |
| 6,455,823 B1 * | 9/2002 | Bulgajewski | H05B 3/26 | 219/543 |
| 6,664,512 B2 * | 12/2003 | Horey | H05B 3/342 | 219/211 |
| 6,710,303 B1 * | 3/2004 | Lorenzen | H05B 3/34 | 174/84 R |
| 6,838,647 B2 * | 1/2005 | Nagele | B62D 1/065 | 219/205 |
| 7,390,059 B2 * | 6/2008 | Brockschnieder | B60N 2/5816 | 297/228.13 |
| 7,390,982 B2 * | 6/2008 | Schmidt | B60N 2/0228 | 200/5 R |
| 7,500,536 B2 * | 3/2009 | Bulgajewski | H05B 3/34 | 177/136 |
| 8,118,362 B2 * | 2/2012 | Nishimura | B60N 2/5685 | 297/180.12 |
| 8,465,093 B2 * | 6/2013 | Janowski | B60N 2/6018 | 297/180.11 |
| 8,723,043 B2 * | 5/2014 | Weiss | H01B 1/22 | 174/117 M |
| 8,948,962 B2 * | 2/2015 | Pywell | B60N 2/0228 | 297/378.12 |
| 9,283,869 B2 * | 3/2016 | Yamamoto | B60N 2/0228 | |
| 9,717,115 B2 * | 7/2017 | Li | A61F 7/007 | |
| 2003/0141983 A1 * | 7/2003 | Schmiz | B60N 2/002 | 340/687 |
| 2003/0173195 A1 * | 9/2003 | Federspiel | H01H 3/141 | 200/85 A |
| 2003/0231485 A1 * | 12/2003 | Chien | A41D 27/085 | 362/84 |
| 2004/0100131 A1 * | 5/2004 | Howick | B60N 2/5678 | 297/180.12 |
| 2005/0184565 A1 * | 8/2005 | Weiss | B60N 2/5635 | 297/180.15 |
| 2005/0204449 A1 * | 9/2005 | Baron | A41D 1/04 | 2/69 |
| 2006/0151455 A1 * | 7/2006 | Stowe | B60N 2/5635 | 219/202 |
| 2008/0296942 A1 * | 12/2008 | Schweiker | B60N 2/5685 | 297/217.3 |
| 2008/0296943 A1 * | 12/2008 | Hirota | A47C 7/38 | 297/217.3 |
| 2010/0000981 A1 * | 1/2010 | Diemer | H05B 3/146 | 219/202 |
| 2010/0038357 A1 * | 2/2010 | Fukuda | H01C 7/021 | 219/553 |
| 2010/0044075 A1 * | 2/2010 | Weiss | H01B 1/22 | 174/126.2 |
| 2010/0052381 A1 * | 3/2010 | Tingley | A61B 5/6887 | 297/217.3 |
| 2012/0091112 A1 * | 4/2012 | Wei | B60N 2/5685 | 219/202 |
| 2013/0068748 A1 * | 3/2013 | Csonti | H05B 3/34 | 219/202 |
| 2013/0105459 A1 * | 5/2013 | Tomas Tapia | B60N 2/5685 | 219/217 |
| 2013/0305974 A1 * | 11/2013 | Ishii | D05B 23/00 | 112/475.08 |
| 2013/0313099 A1 * | 11/2013 | Komaki | H01H 13/704 | 200/600 |
| 2015/0190269 A1 * | 7/2015 | Lenoble | A61F 5/30 | 128/894 |
| 2015/0375654 A1 * | 12/2015 | Lemarchand | D05B 15/00 | 297/452.1 |
| 2018/0003579 A1 * | 1/2018 | Esposito | A61B 5/6806 | |
| 2018/0093596 A1 * | 4/2018 | Kumagai | B60N 2/5883 | |
| 2018/0099582 A1 * | 4/2018 | Worlitz | B60N 2/58 | |
| 2018/0261054 A1 * | 9/2018 | Eryilmaz | A41B 1/08 | |
| 2018/0338544 A1 * | 11/2018 | Huang | A41D 1/005 | |
| 2018/0345832 A1 * | 12/2018 | Kumagai | A47C 31/02 | |
| 2018/0368559 A1 * | 12/2018 | Wang | A45F 5/00 | |
| 2019/0006872 A1 * | 1/2019 | Ali | H02J 7/025 | |

\* cited by examiner

MOTOR VEHICLE INTERIOR ARRANGEMENT

STATEMENT OF RELATED APPLICATIONS

This application claims priority on and the benefit of German Patent Application No. 20 2016 105 638.1 having a filing date of 8 Oct. 2016.

BACKGROUND OF THE INVENTION

Technical Field

The invention relates to a motor vehicle interior arrangement, in particular a motor vehicle seat, having a decorative element, in particular piping or a decorative strip, which is arranged at least with an outer side visible on a part of the motor vehicle interior arrangement, in particular on a seat cover or an inner wall of the motor vehicle interior arrangement.

Prior Art

Corresponding arrangements frequently have so-called decorative elements for the design beautification of components in the motor vehicle interior. In this case, this can be piping which is arranged, for example, at the boundary between seat surface and lateral seat part or backrest surface and lateral backrest. Decorative strips of all types are also known, for example, to design the formation of seat covers or inner walls in the motor vehicle interior.

Furthermore, operating or actuating elements of all types are known in the motor vehicle interior, using which a variety of settings may be carried out by the user. In particular in the case of vehicle seats or in the inner wall region, a variety of setting options are found for adjusting the seat, for example, actuating or regulating the backrest inclination adjustment, seat length adjustment, seat height adjustment, illumination, seat ventilation, seat heating, seat depth adjustment, head support adjustment, lumbar adjustment, side bolster adjustment, seat massage function, etc.

In general, these are switches, in particular buttons or rocker switches, or slide controllers, using which the mentioned adjustments can be performed. Such switches are, on the one hand, susceptible to external influences, for example, moisture or contaminants, so that the function can sometimes no longer be properly executed. Moreover, such switches are generally complexly formed elements, in particular made of plastic, for which corresponding tools have to be kept ready to produce them. Moreover, they can also interfere with the overall image in the vehicle interior.

BRIEF SUMMARY OF THE INVENTION

The object of the present invention is therefore to provide a motor vehicle interior arrangement of the type mentioned at the outset, which in particular does not have the described disadvantages.

This object is achieved by a motor vehicle interior arrangement, in particular a motor vehicle seat, having a decorative element, in particular piping or a decorative strip, which is arranged at least with an outer side visible on a part of the motor vehicle interior arrangement, in particular on a seat cover or an inner wall of the motor vehicle interior arrangement, characterized in that the decorative element has an electrically conductive element which generates an electrical field. Advantageous embodiments are found in the dependent claims.

According to the invention, the decorative element, which can be piping or a decorative strip on a motor vehicle seat or another component in the motor vehicle interior, has an electrically conductive element. This electrically conductive element is capable of generating an electrical field when it is brought to a potential different from the ground potential. If this is the case, for example, the presence of a finger of an operator can induce a change of this electrical field. This change can be acquired according to the invention and further processed as a switching pulse by a control unit, to control or actuate certain functions in the motor vehicle interior, for example, adjustments, in particular of the seat, or lights.

The decorative element may generally also be embodied by buttons. The switching point can thus be felt with the hands, without visual contact of the operator. The desired function can be triggered without the operator having to look more closely at the switching region.

The electrically conductive element can be, for example, part of a piping cord and/or part of a material enclosing the piping cord and/or part of a decorative strip. In this manner, elements already existing in the vehicle interior, in particular the vehicle seat, which actually exclusively have a decorative function, can be used for the purpose of housing technical functions.

In particular, the electrically conductive element can be enclosed by a nonconductive external material, in particular the material of the piping flap. In this manner, moisture—for example from the hand of the user—can be prevented from coming into contact with the electrically conductive element and thus inducing incorrect operations.

For this purpose, it can be provided in particular that the external material is electrically nonconductive or is at least formed in a sufficiently large material thickness.

To entirely avoid the introduction of moisture, the external material or in any case the material enclosing the electrically conductive element can be made liquid-impermeable. This can be achieved in particular in that the electrically conductive element is encapsulated, in particular by the external material. In this manner, incorrect operations or unintended malfunctions, for example, by spilling beverages or other liquids in the vehicle interior, can be avoided.

The motor vehicle interior arrangement according to the invention, which is in particular a seat arrangement, in particular a motor vehicle seat arrangement, preferably has a seat, in particular a motor vehicle seat, having a backrest and a seat part and also a cover material, as described above, wherein the electrically conductive element is switched to an electrical potential difference from the ground potential and thus generates an electrical field.

The seat arrangement can furthermore have a control unit, which is coupled to the electrically conductive element such that by approaching, in particular touching, the outer side of the decorative element by way of a finger of an operator, the electrical field is changed. In this case, the control unit is designed so that it receives an electrical signal generated by changing the electrical field.

The control unit can process the signals and output control pulses, using which a seat function can then be controlled. The switch formed by the electrically conductive element is preferably a capacitive switch.

The seat arrangement therefore preferably has at least one seat function addressable by the control unit as a result of the generated signal. Seat functions can comprise at least one of the following functions: backrest inclination adjustment, seat length adjustment, seat height adjustment, illumination, seat ventilation, seat heating, seat depth adjustment, lumbar adjustment, head support adjustment, side bolster adjustment, seat massage function.

BRIEF SUMMARY OF THE DRAWINGS

The invention will be explained in greater detail hereafter on the basis of exemplary embodiments in FIGS. 1 to 5.

DETAILED DESCRIPTION OF PREFERRED EMBODIMENTS

Figure 1:
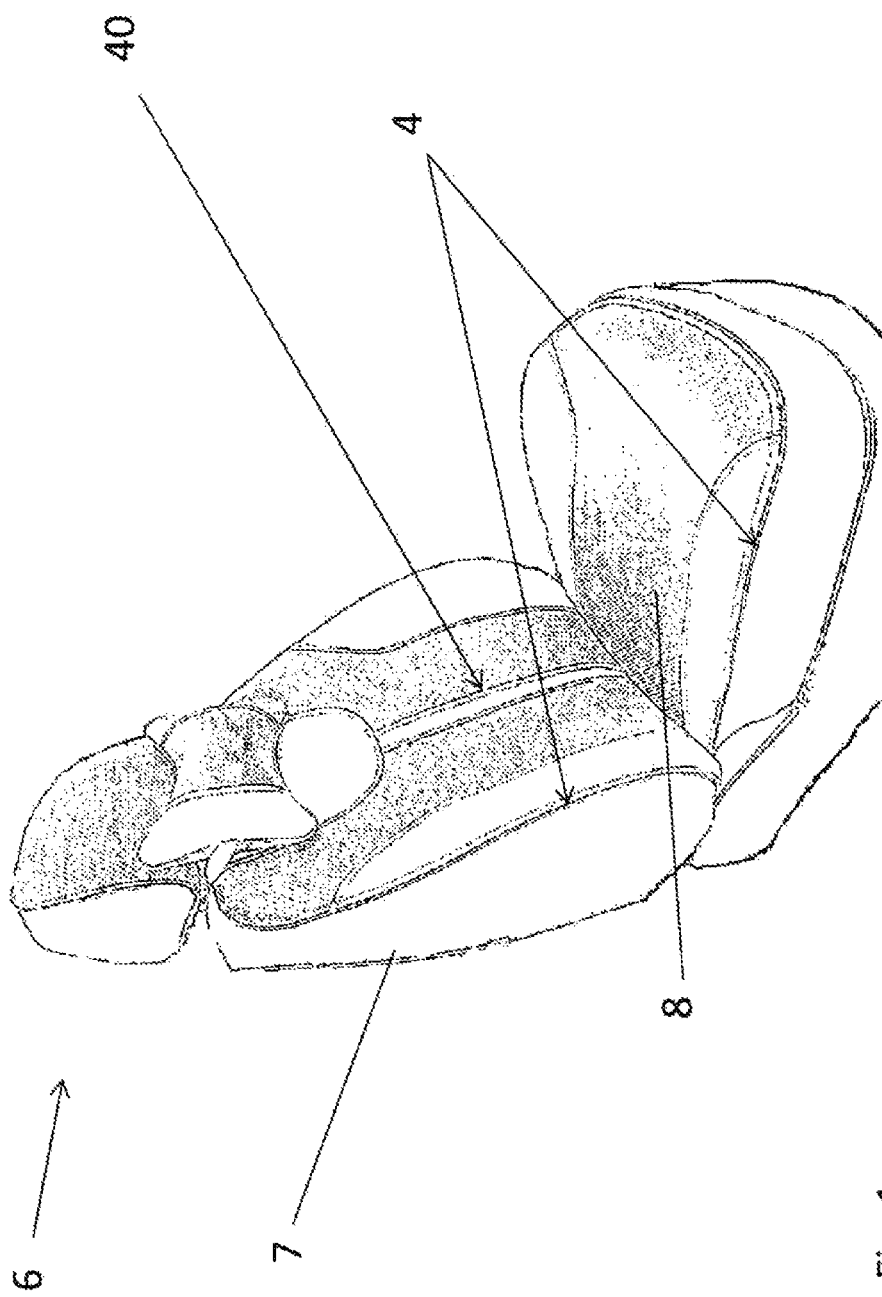
FIG. 1 shows a perspective view of a vehicle seat, which can be part of a motor vehicle interior arrangement according to the invention.

In FIG. 1, a motor vehicle seat 6 is shown as part of a motor vehicle interior arrangement according to the invention. The seat has a backrest 7 and a seat part 8. In particular in motor vehicle seats, it is typical that decorative elements, for example, piping 4, are provided in the regions of the transitions between the side of the seat part 8 for the backrest 7 and the seat surface or backrest surface, respectively, facing toward the occupant. Other decorative elements are also regularly located in seats, for example, decorative bands or decorative strips 40, which can be part of a seat cover, but can also be applied to the seat cover. Similar elements as are shown by way of example on the seat here can also be located at other points in the motor vehicle interior, thus, for example, on the inner sides of the doors or in the region of the dashboard or in the center console, etc.

According to the invention, these regions on the decorative elements 4, 40 are used as switch elements, to conveniently activate settings in the vehicle interior, thus, for example, seat adjustment such as backrest inclination adjustment, seat length adjustment, seat height adjustment, illumination, seat ventilation, seat heating, seat depth adjustment, head support adjustment, lumbar adjustment, side bolster adjustment, seat massage function, illumination, and the like.

Figure 2:
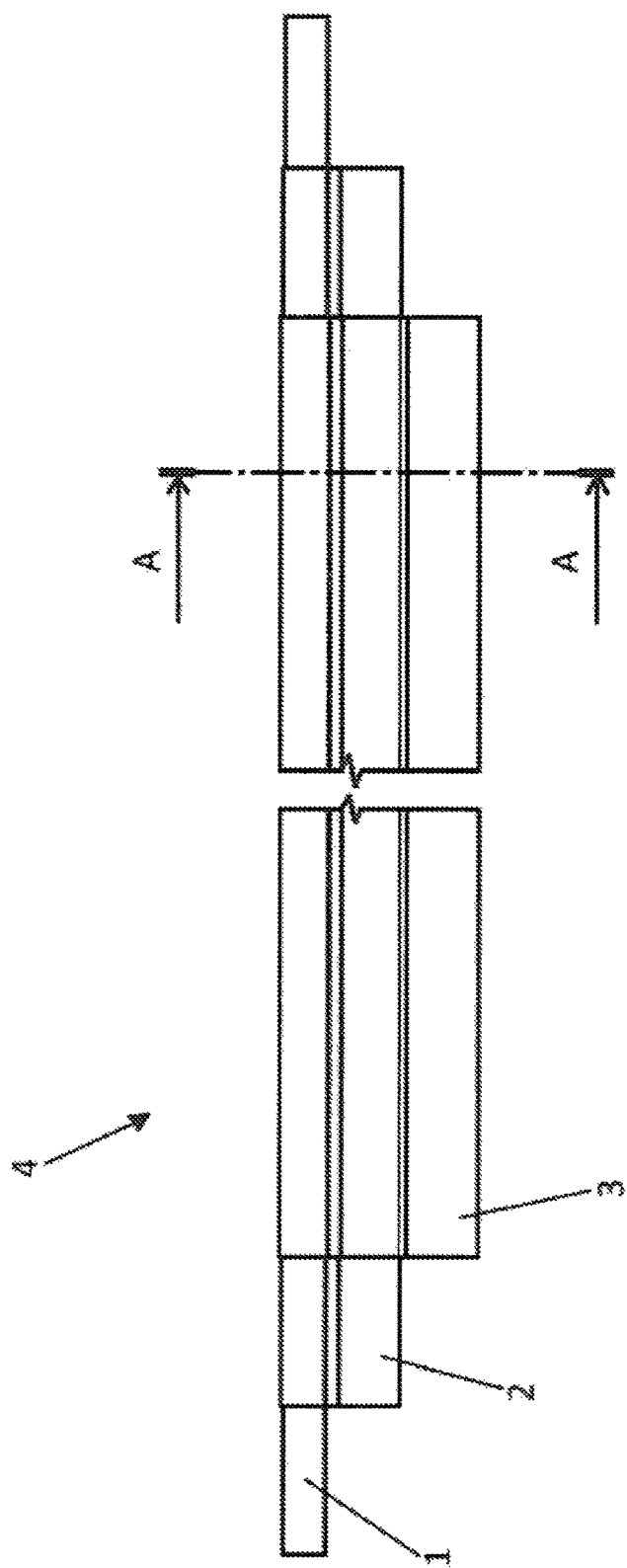
FIG. 2 shows a longitudinal view of a decorative element designed as piping.
Figure 3:
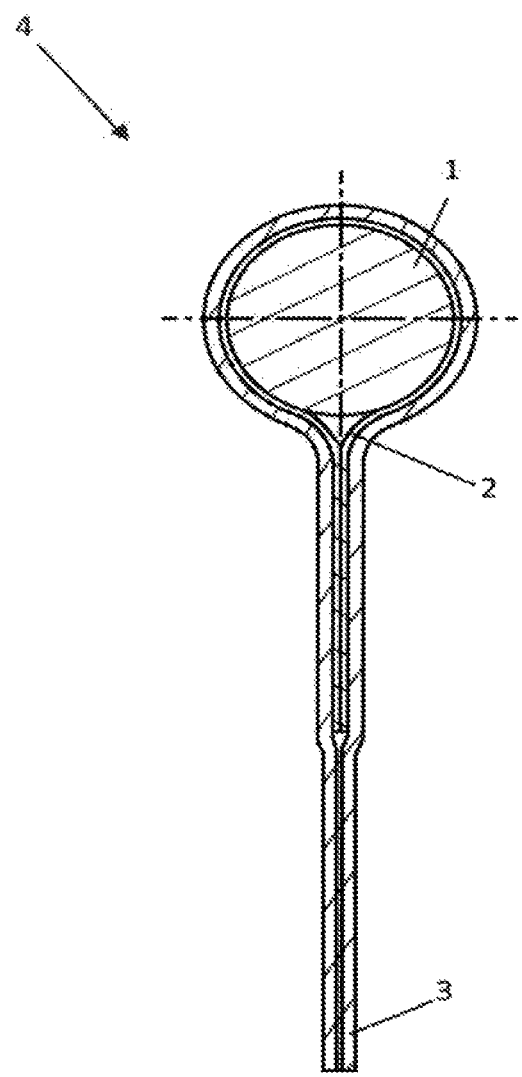
FIG. 3 shows a cross section of the piping shown in FIG. 2 along line A-A.

FIGS. 2 and 3 show, on the basis of an exemplary embodiment, how piping 4 can be used for the mentioned functionality. The piping 4 receives its inner formation by way of a piping cord 1, around which a piping flap 3 forming the outer side of the decorative element is wrapped. The piping flap 3 is then, for example, connected and/or sewn to the cushion material of the motor vehicle seat 6 (FIG. 1). In the example shown, an electrically conductive element 2 is provided, which is arranged between piping cord 1 and piping flap 3. This electrically conductive element 2 is connected to the vehicle electrical system and can be brought to a potential different from the ground potential. The piping 4 shown is then used according to the invention as a capacitive switch, by interacting with a controller (not shown), which activates one of the above-mentioned functions, for example, in response a touch of the piping 4 by the finger of an operator. As an alternative to the embodiment shown in FIGS. 2 and 3, it can also be provided that the electrically conductive element is comprised by the piping cord 1. An additional element 2 can then be omitted. The piping flap 3 can be designed as nonconductive and/or liquid-impermeable in any case. In this manner, the electrically conductive element is shielded from external interfering influences. In particular in the case of the liquid impermeability, moisture can be prevented from externally inducing malfunctions in the electrical switches thus designed.

To actuate a function, it can be provided that the piping 4 is merely briefly touched by the finger or the finger is guided along the longitudinal extension of the piping 4 by a certain length, for example, to implement a seat length adjustment up to the desired adjustment position.

Figure 5:
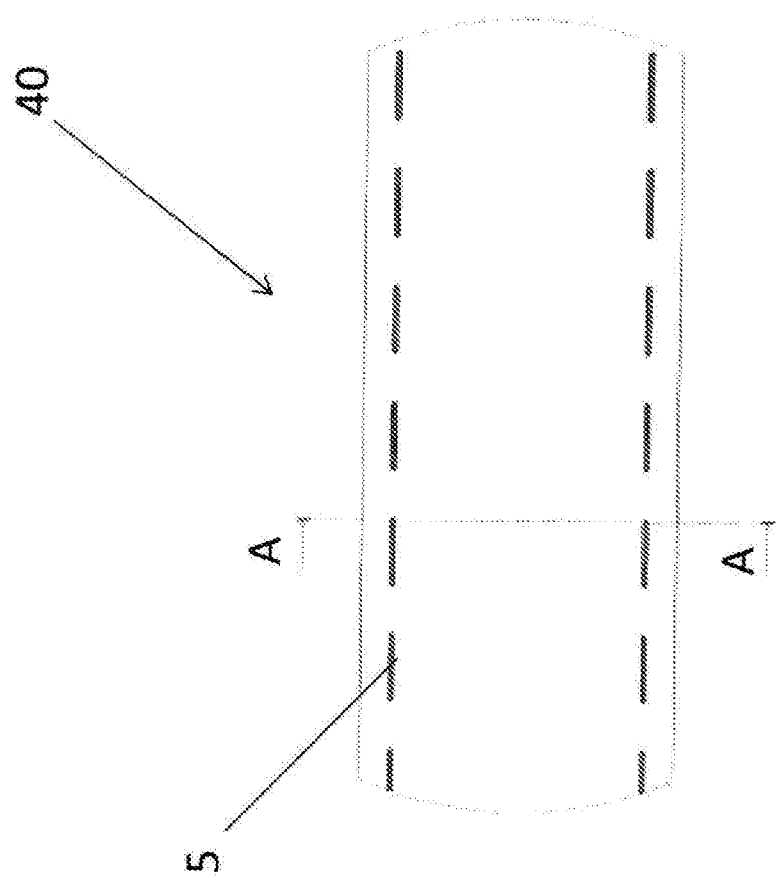
FIG. 5 shows a top view of a decorative element designed as a decorative band or decorative strip.
Figure 4:
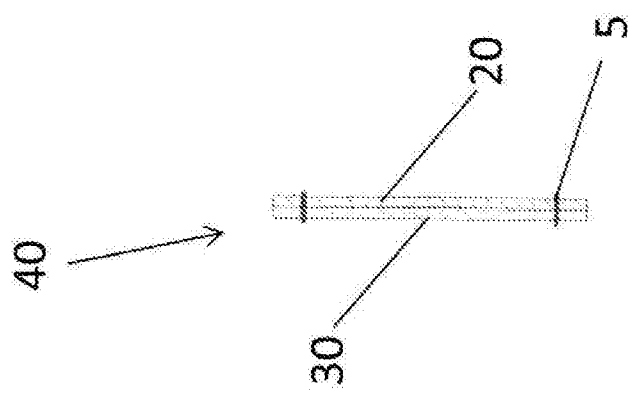
FIG. 4 shows a cross section of a decorative element, which is shown in FIG. 5 and is designed as a decorative band or decorative strip, along line A-A in FIG. 5.

A second embodiment for a decorative element according to the invention is shown in FIGS. 4 and 5. The decorative element is designed here as a decorative strip 40, wherein it can be a band-type element, which can be sewn, for example, to the cushion material of a motor vehicle seat. Position 5 are corresponding seams. The outer side of the decorative strip 40 is formed by a nonconductive and/or liquid-impermeable layer 30, below which a conductive layer 20 is provided. The outer side 30 has the same function as the piping flap 3 in the preceding exemplary embodiment. The conductive layer 20 also has the same function as the element 2 in the preceding exemplary embodiment, so that reference is made to the above statements for details on the function. It is important that the layer 20 is applied to the side of the decorative element 40 which does not face the motor vehicle interior, so that no impairment of the switch thus formed can occur due to interfering external influences.

By way of the present invention, decorative elements can be used in the motor vehicle interior to address functions for which separate switches otherwise have to be used. Switches may be integrated in this manner in particular in the already existing interior design of the motor vehicle interior, without having to change anything in the design.

What is claimed is:

1. A motor vehicle interior arrangement, namely a motor vehicle seat, having a decorative element, configured as piping or a decorative strip, which is arranged at least with an outer side visible on a part of the motor vehicle interior arrangement, namely on a seat cover or an inner wall of the motor vehicle interior arrangement,
   wherein the decorative element comprises an electrically conductive element which generates an electrical field,
   wherein the electrically conductive element is enclosed by a nonconductive external material, and
   wherein the nonconductive external material is material of a piping flap.

2. The motor vehicle interior arrangement according to claim 1,
   wherein the electrically conductive element is part of at least one of a piping cord, part of a material enclosing the piping cord, and part of a decorative strip.

3. The motor vehicle interior arrangement according to claim 1,
   wherein the nonconductive external material is made liquid-impermeable.

4. The motor vehicle interior arrangement according to claim 3, wherein the external material is made liquid-impermeable by encapsulating the electrically conductive element in the external material.

5. The motor vehicle interior arrangement according to claim 1, wherein the external material is made liquid-impermeable by encapsulating the electrically conductive element.

6. The motor vehicle interior arrangement according to claim 1, wherein the external material made liquid-impermeable by encapsulating the electrically conductive element in the external material.

7. A motor vehicle interior arrangement,
having a motor vehicle seat comprising an electrically conductive element which generates an electrical field,
wherein the electrically conductive element is switched to an electrical potential different from a ground potential and thus generates an electrical field,
wherein the electrically conductive element is enclosed by a nonconductive external material, and
wherein the nonconductive external material is material of a piping flap.

8. The motor vehicle interior arrangement according to claim 7,
further comprising a control unit, which is coupled to the electrically conductive element such that by touching an external material enclosing the electrically conducting element by way of a finger of an operator, the electrical field is changed, and wherein the control unit is designed so that it receives an electrical signal generated by changing the electrical field.

9. The motor vehicle interior arrangement according to claim 8,
further comprising electrical seat functions addressable by the control unit as a result of the generated electrical signal.

10. The motor vehicle interior arrangement according to claim 9,
wherein the electrical seat function comprises at least one of the following functions:
backrest inclination adjustment, seat length adjustment, seat height adjustment, illumination, seat ventilation, seat heating, seat depth adjustment, head support adjustment, lumbar adjustment, side bolster adjustment, and seat massage function.

* * * * *